(12) United States Patent
Ptacek et al.

(10) Patent No.: US 11,817,784 B2
(45) Date of Patent: Nov. 14, 2023

(54) SWITCHING SLEW RATE CONTROL FOR GATE DRIVERS

(71) Applicant: SEMICONDUCTOR COMPONENTS INDUSTRIES, LLC, Phoenix, AZ (US)

(72) Inventors: Karel Ptacek, Roznov Pod Radhostem (CZ); Roman Stuler, Karolinka (CZ); Roman Radvan, Roznov pod Radhostem (CZ)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 173 days.

(21) Appl. No.: 17/647,631

(22) Filed: Jan. 11, 2022

(65) Prior Publication Data
US 2023/0223850 A1    Jul. 13, 2023

(51) Int. Cl.
*H02M 1/08* (2006.01)
*H02M 3/158* (2006.01)
*H02M 1/00* (2006.01)
*H03K 17/16* (2006.01)

(52) U.S. Cl.
CPC ......... *H02M 3/158* (2013.01); *H02M 1/0009* (2021.05); *H02M 1/0025* (2021.05); *H02M 1/0029* (2021.05); *H02M 1/08* (2013.01); *H03K 17/162* (2013.01)

(58) Field of Classification Search
CPC ............................. H02M 1/08; H02M 1/0029
See application file for complete search history.

(56) References Cited

U.S. PATENT DOCUMENTS

| | | |
|---|---|---|
| 2018/0034456 A1 | 2/2018 | Lee |
| 2018/0151202 A1 | 5/2018 | Mengad |
| 2021/0359674 A1* | 11/2021 | Keskar ............. H03K 17/04206 |

OTHER PUBLICATIONS

Texas Instruments, Data Sheet, LMG341xR050 600-V 50 mΩ Integrated GaN Fet Power Stage With Overcurrent Protection, SNOSD81B—Sep. 2018, Revised Jan. 2020.

* cited by examiner

*Primary Examiner* — Alex Torres-Rivera
(74) *Attorney, Agent, or Firm* — Dickinson Wright PLLC; Jonathan A. Schnayer

(57) ABSTRACT

Switching circuits, half-bridge power converters, and methods for operating a switching circuit including a switching transistor coupled to a load. The method includes applying, with a driver, a gate voltage to the switching transistor. The method also includes generating, with a feedback capacitor, a feedback current based on a change in a voltage sensed at a drain terminal of the switching transistor when the switching transistor turns on. The method further includes applying the feedback current to the driver to limit the gate voltage applied to the switching transistor. The method also includes adjusting, with a controller, a switching slew rate of the switching transistor by draining an amount of the feedback current.

20 Claims, 10 Drawing Sheets

SWITCHING SLEW RATE CONTROL FOR GATE DRIVERS

BACKGROUND

Voltage slew rate on a power switch during switching processes significantly affects, e.g., commutation current, switching power losses, and generated electromagnetic interference (EMI) in a power stage of a switched-mode power supply. Voltage slew rate during the turn-on process of a power switch is affected, e.g., by the turn-on gate drive resistor or the driver source current capability and should be adjusted for given power stage/application to achieve optimum performance. Voltage slew rate during the turn-off process is mainly given by the switch output capacitance and inductive current that is available in the power stage at the time the power switch is turned-off. In other words, the turn-off gate resistor or the sink driver capability has less impact on turn-off slew rate control. It is beneficial to have a gate driver that allows automatic switching slew rate control that is invariant to used power switch parameters.

SUMMARY

The presented disclosure provides a method for operating a switching circuit including a switching transistor coupled to a load. The method includes applying, with a driver, a gate voltage to the switching transistor. The method also includes generating, with a feedback capacitor, a feedback current based on a change in a voltage sensed at a drain terminal of the switching transistor when the switching transistor turns on. The method further includes applying the feedback current to the driver to limit the gate voltage applied to the switching transistor. The method also includes adjusting, with a controller, a switching slew rate of the switching transistor by draining an amount of the feedback current.

The present disclosure also provides a switching circuit including, in one implementation, a switching transistor, a driver, a feedback capacitor, and a controller. The switching transistor is coupled to a load. The driver includes a voltage follower transistor, a gate capacitor, a current source, and a current source. The voltage follower transistor is configured to apply a gate voltage to the switching transistor. The gate capacitor is coupled to a gate terminal of the voltage follower transistor. The current source is configured to apply a constant current to the gate capacitor. The feedback capacitor is coupled to a drain terminal of the switching transistor to generate a feedback current based on a change in a voltage sensed at the drain terminal of the switching transistor when the switching transistor turns on. The feedback current interferes with the constant current and limits the gate voltage applied to the gate terminal of the switching transistor. The controller is configured to adjust a switching slew rate of the switching transistor by draining an amount of the feedback current.

The present disclosure further provides a half-bridge power converter including, in one implementation, a first switching circuit and a second switching circuit. The first switching circuit is coupled to a load. The second switching circuit includes, in one implementation, a switching transistor, a driver, a feedback capacitor, and a controller. The switching transistor is coupled to the load. The driver is configured to apply a gate voltage to the switching transistor. The feedback capacitor is coupled to a drain terminal of the switching transistor to generate a feedback current based on a change in a voltage sensed at the drain terminal of the switching transistor when the switching transistor turns on. The feedback current limits the gate voltage applied to a gate terminal of the switching transistor. The controller is configured to adjust a switching slew rate of the switching transistor by draining an amount of the feedback current.

BRIEF DESCRIPTION OF THE DRAWINGS

For a detailed description of example implementations, reference will now be made to the accompanying drawings in which.

DEFINITIONS

Figure 1:
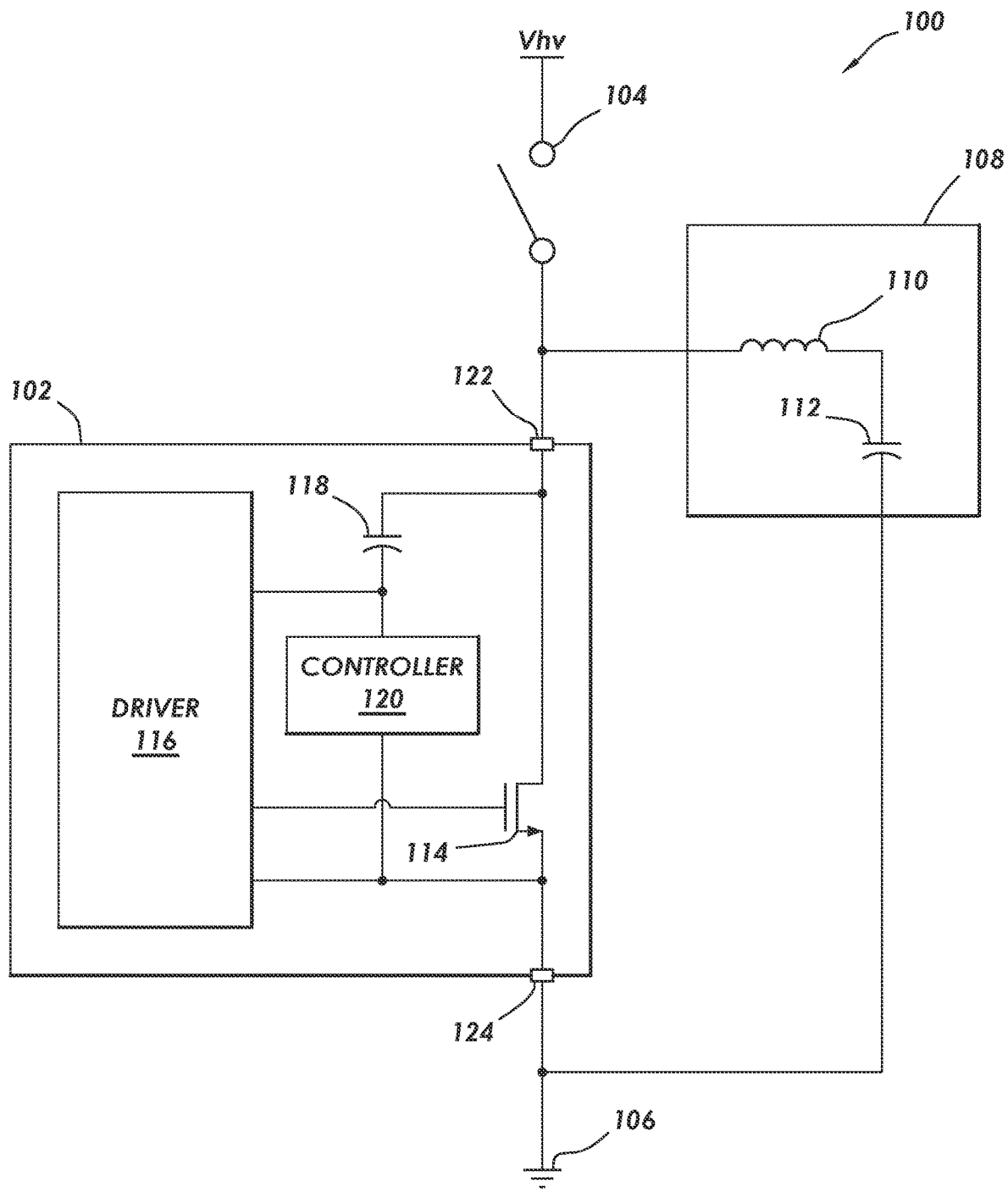
FIG. 1 is a partial schematic and a partial block diagram of an example of a half-bridge power converter in accordance with some implementations.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

The terms "input" and "output" when used as nouns refer to connections (e.g., electrical, software), and shall not be read as verbs requiring action. For example, a timer circuit may define a clock output. The example timer circuit may create or drive a clock signal on the clock output. In systems implemented directly in hardware (e.g., on a semiconductor substrate), these "inputs" and "outputs" define electrical connections. In systems implemented in software, these "inputs" and "outputs" define parameters read by or written by, respectively, the instructions implementing the function.

"Assert" shall mean changing the state of a Boolean signal. Boolean signals may be asserted high or with a higher voltage, and Boolean signals may be asserted low or with a lower voltage, at the discretion of the circuit designer. Similarly, "de-assert" shall mean changing the state of the Boolean signal to a voltage level opposite the asserted state.

"Controller" shall mean, alone or in combination, individual circuit components, an application specific integrated circuit (ASIC), a microcontroller with controlling software, a reduced-instruction-set computing (RISC), a digital signal processor (DSP), process with controlling software, a processor with controlling software, a programmable logic device (PLD), or a field programmable gate array (FPGA), configured to read inputs and drive outputs responsive to the inputs.

DETAILED DESCRIPTION

The following discussion is directed to various implementations of the invention. Although one or more of these implementations may be preferred, the implementations disclosed should not be interpreted, or otherwise used, as limiting the scope of the present disclosure, including the claims. In addition, one skilled in the art will understand that the following description has broad application, and the discussion of any implementation is meant only to be exemplary of that implementation, and not intended to intimate that the scope of the present disclosure, including the claims, is limited to that implementation.

Switching slew rate adjustment for a stand-alone switch is not complicated as an external gate driver may be used and a user can control the external gate resistor value. However, switching slew rate control for a power switch with an integrated driver is more complicated because the power switch gate is not usually accessible within the integrated switch package. Slew rate for a power switch with an integrated driver may be set to a preferred value by the gate driver strength or an internal gate resistor. However, with these solutions, the slew rate cannot be changed easily when application parameters require. Further, the Miller capacitance of a power switch is non-linear and affects gate charging current dynamically. Thus, switching slew rate changes during switching processes in which an internal gate resistor or fixed driver current capacity technique is used. The miller capacitance is also specific to a given power switch type. Thus, a different switch will have a different slew rate even if the driver is the same. The slew rate needs to be adjusted for given switch parameters.

Various examples of the present disclosure are directed to half-bridge power converters with gate drivers that control switching slew rate. More particularly, various examples are directed to switching circuits that modulate switching slew rate. The specification now turns to an example system to orient the reader.

FIG. 1 is a partial schematic and a partial block diagram of an example of half-bridge power converter 100 in accordance with some implementations. The half-bridge power converter 100 illustrated in FIG. 1 includes a pair of switching circuits 102 and 104 positioned in a series configuration between a supply voltage Vhv and a reference terminal 106 (e.g., a ground terminal). Switching circuit 102 (one example of a "lower switching circuit" or a "second switching circuit") is coupled between a load 108 and the reference terminal 106. In FIG. 1, the load 108 is formed by an inductor 110 and a capacitor 112 arranged in a series configuration. Switching circuit 104 (one example of an "upper switching circuit" or a "first switching circuit") is coupled between the supply voltage Vhv and the load 108. The switching circuits 102 and 104 alternate back and forth to switch the voltage at the load 108. The half-bridge power converter 100 illustrated in FIG. 1 is provided as one example of such a power converter. The methods described herein may be used with power converters having fewer, additional, or different components in different configurations than the half-bridge power converter 100 illustrated in FIG. 1. In some implementations, switching circuit 102 and switching circuit 104 are separate components (as illustrated in FIG. 1). In alternate implementations, switching circuit 102 and switching circuit 104 may be part of the same component. For example, switching circuit 102 and switching circuit 104 may both be positioned on a single printed circuit board and/or within a single chip housing.

Figure 2:
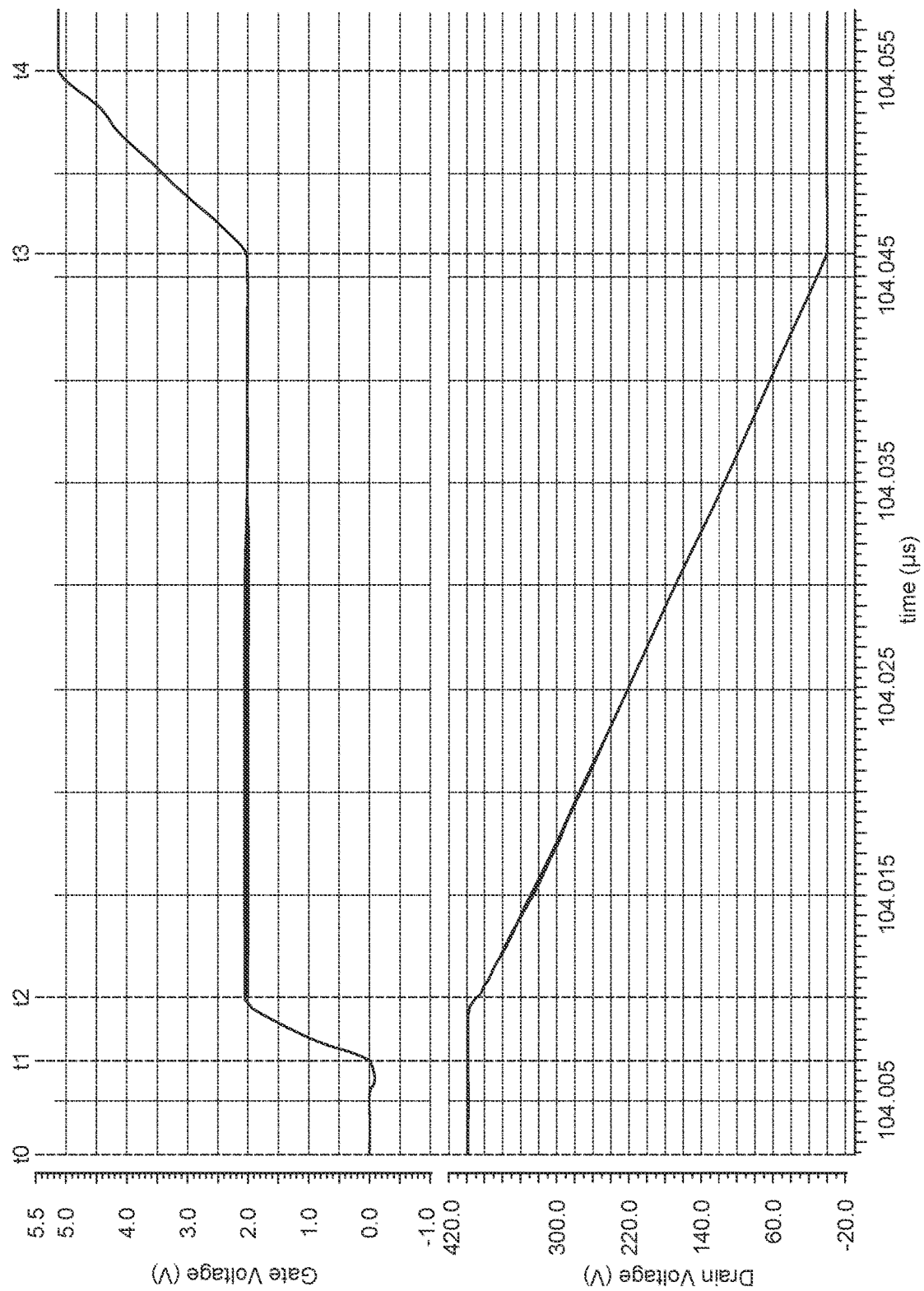
FIG. 2 is a timing diagram of an example of a switching operation of a switching circuit.

Switching circuit 102 illustrated in FIG. 1 includes a switching transistor 114, a driver 116, a feedback capacitor 118, and a controller 120. Switching circuit 102 also includes a power terminal 122 coupled to the drain terminal of the switching transistor 114 and a power terminal 124 coupled to the source terminal of the switching transistor 114. In some implementations, the switching transistor 114 includes a gallium nitride (GaN) transistor. The driver 116 is coupled to the gate terminal of the switching transistor 114 and is configured to apply a gate voltage to the switching transistor 114. The feedback capacitor 118 is coupled between the drain terminal of the switching transistor 114 and the driver 116. The feedback capacitor 118 is also coupled to the controller 120, as will be described in more detail below. In some implementations, the feedback capacitor 118 includes a linear (voltage invariant) high-voltage capacitor. The feedback capacitor 118 generates a feedback current based on a change in voltage at the drain terminal of the switching transistor 114. The feedback current is applied to the driver 116 to limit the gate voltage applied to the gate terminal of the switching transistor 114 by the driver 116. For example, FIG. 2 is a timing diagram of an example of a switching operation. At time t0 in FIG. 2, the switching transistor 114 is turned off (as indicated by a gate voltage of zero) and the drain voltage is approximately 400 Volts. At time t1, the driver 116 increases the gate voltage applied to the switching transistor 114 until the gate voltage reaches the threshold voltage of the switching transistor 114 at time t2. At time t2, the switching transistor 114 turns on and the drain voltage of the switching transistor 114 starts to decline. The decline of the drain voltage generates feedback current through the feedback capacitor 118. The feedback current is applied to the driver 116 to keep the gate voltage of the switching transistor 114 constant (as indicted by the constant gate voltage between times t2 and t3 in FIG. 2). When the drain voltage reaches zero at time t3, feedback current is no longer generated though the feedback capacitor 118 and the gate voltage of the switching transistor 114 increases again until the switching transistor 114 is fully turned on at time t4.

Figure 3:
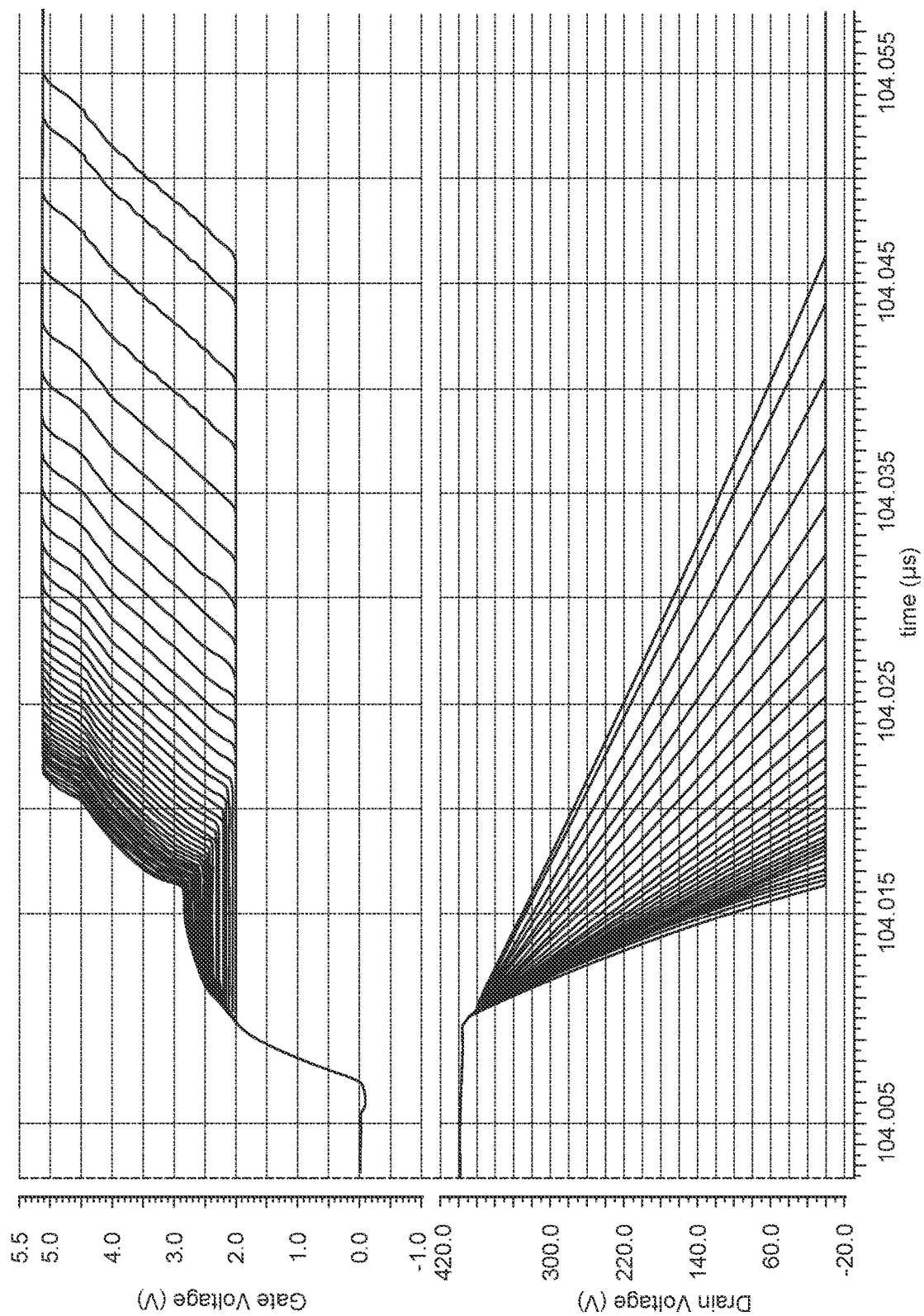
FIG. 3 is a timing diagram of examples of switching operations of a switching circuit at different feedback currents.

The feedback current generated through the feedback capacitor 118 keeps the switching slew rate of the drain voltage constant throughout the transition. However, without the controller 120, the switching slew rate is set primarily based on the capacitance of the feedback capacitor 118 and a constant current of the driver 116 which will be described in more detail below. Thus, the switching slew rate of different switching circuits may vary due to, e.g., process variations. The controller 120 is configured to adjust the switching slew rate of the switching transistor 114 by draining an amount of the feedback current. For example, FIG. 3 is a timing diagram of examples of switching operations in which the controller 120 drains different amounts of feedback current. As illustrated in FIG. 3, the switching slew rate increases when the controller 120 drains a higher amount of feedback current. Thus, the switching slew rate of the switching transistor is set by adjusting the amount of feedback current drained by the controller 120.

Figure 4:
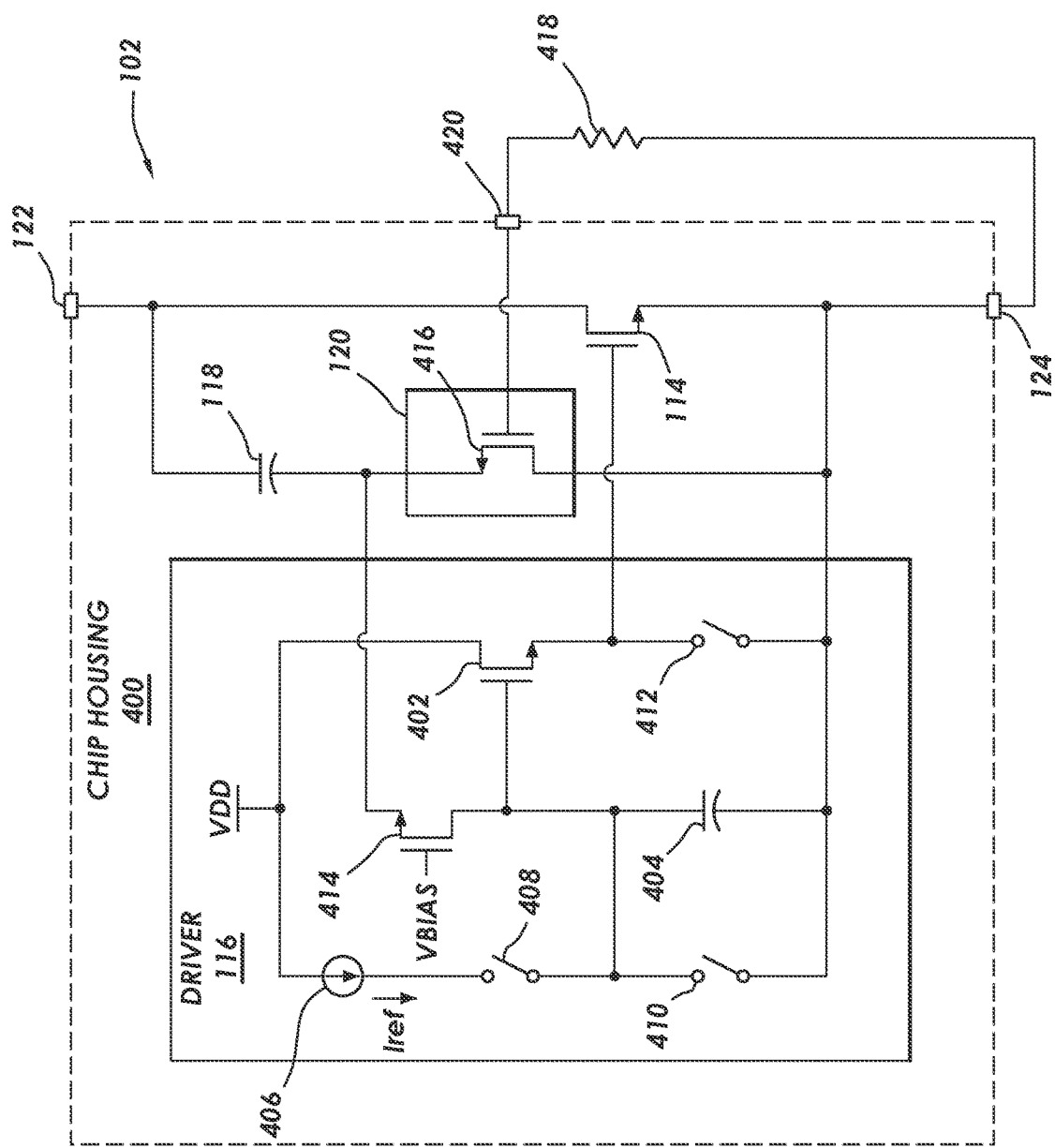
FIG. 4 is a schematic diagram of an example of a switching circuit included in the half-bridge power converter of FIG. 1 in accordance with some implementations.

FIG. 4 is a schematic diagram of an example of the switching circuit 102 in accordance with some implementations. In particular, the switching circuit 102 may comprise electrical devices and circuits monolithically created on a substrate and encapsulated within packaging (e.g., chip housing 400); however, the functionality of the various components may be embodied on multiple substrates that are co-packaged (e.g., multi-chip module) and electrically coupled to each other and coupled to the various terminals. The switching circuit illustrated in FIG. 4 includes the switching transistor 114, the driver 116, the feedback capacitor 118, and the controller 120, power terminal 122, and power terminal 124. The driver 116 illustrated in FIG. 4 includes a voltage follower transistor 402, a gate capacitor 404, a current source 406, a plurality of switches 408, 410, and 412, and a biasing transistor 414. The voltage follower transistor 402 is configured to apply a gate voltage to the gate terminal of the switching transistor 114. The source terminal of the voltage follower transistor 402 is coupled to the gate terminal of the switching transistor 114. The drain terminal of the voltage follower transistor 402 is coupled to a supply voltage VDD. The voltage follower transistor 402 is illustrated in FIG. 4 as a metal-oxide-semiconductor field-effect transistor (MOSFET), and in particular, an N-channel MOSFET. However, other types of FETs may be used (e.g., a P-channel MOSFET), and in fact other types of transistors may also be used (e.g., a bi-polar junction transistor (BJT)).

The gate capacitor 404 is coupled between the gate terminal of the voltage follower transistor 402 and the reference terminal 106 (via power terminal 124). The gate capacitor 404 sets the gate voltage of the voltage follower transistor 402. When switch 408 is switched off and switches 410 and 412 are both switched on, the voltage follower transistor 402 is switched off, and consequently, the switching transistor 114 is switched off as well. When switch 408 is switched on and switches 410 and 412 are both switched off, the current source 406 supplies a constant current Iref to the gate capacitor 404. The feedback capacitor 118 is coupled to the drain terminal of the switching transistor 114 and generates feedback current based on a change in voltage at the drain terminal of the switching transistor 114. The feedback capacitor 118 is also coupled to the gate terminal of the voltage follower transistor 402 (via the biasing transistor 414). The feedback current generated by the feedback capacitor 118 interferes with the constant current Iref supplied by the current source 406 and causes the gate voltage of the voltage follower transistor 402 to remain substantially constant during the drain transition of the switching transistor 114. Thus, the gate voltage of the switching transistor 114 also remains substantially constant during the drain transition of the switching transistor 114.

The controller 120 illustrated in FIG. 4 includes a control transistor 416 coupled between the feedback capacitor 118 and the reference terminal 106 (via power terminal 124). The control transistor 416 drains current from the feedback current. The amount of feedback current drained by the control transistor 416 is set based on the gate voltage applied to the control transistor 416. In some implementations, the controller 120 is configured to adjust the switching slew rate of the switching transistor 114 based on an external control signal. For example, the gate terminal of the control transistor 416 illustrated in FIG. 4 is coupled to an external resistor 418 via a control terminal 420 (e.g., an external input/output pin). External resistor 418 illustrated in FIG. 4 is coupled between control terminal 420 and power terminal 124. The controller 120 is configured to source current via control terminal 420, thus, the external resistor 418 (or more particular, the resistance value of the external resistor 418) sets the gate voltage of the control transistor 416. In some implementations, control terminal 420 is coupled to the supply voltage VDD to source a constant current and develop voltage on external resistor 418. In some implementations, an external voltage source (not shown) is coupled between control terminal 420 and the power terminal 124 to set the gate voltage of the control transistor 416.

The biasing transistor 414 is configured to adjust the feedback current. In this manner, the biasing transistor 414 defines the ratio between the gate voltage of the control transistor 416 and the switching slew rate. In some implementations, the driver 116 does not include the biasing transistor 414 and the feedback capacitor 118 is directly coupled to the gate terminal of the voltage follower transistor 402.

Figure 5:
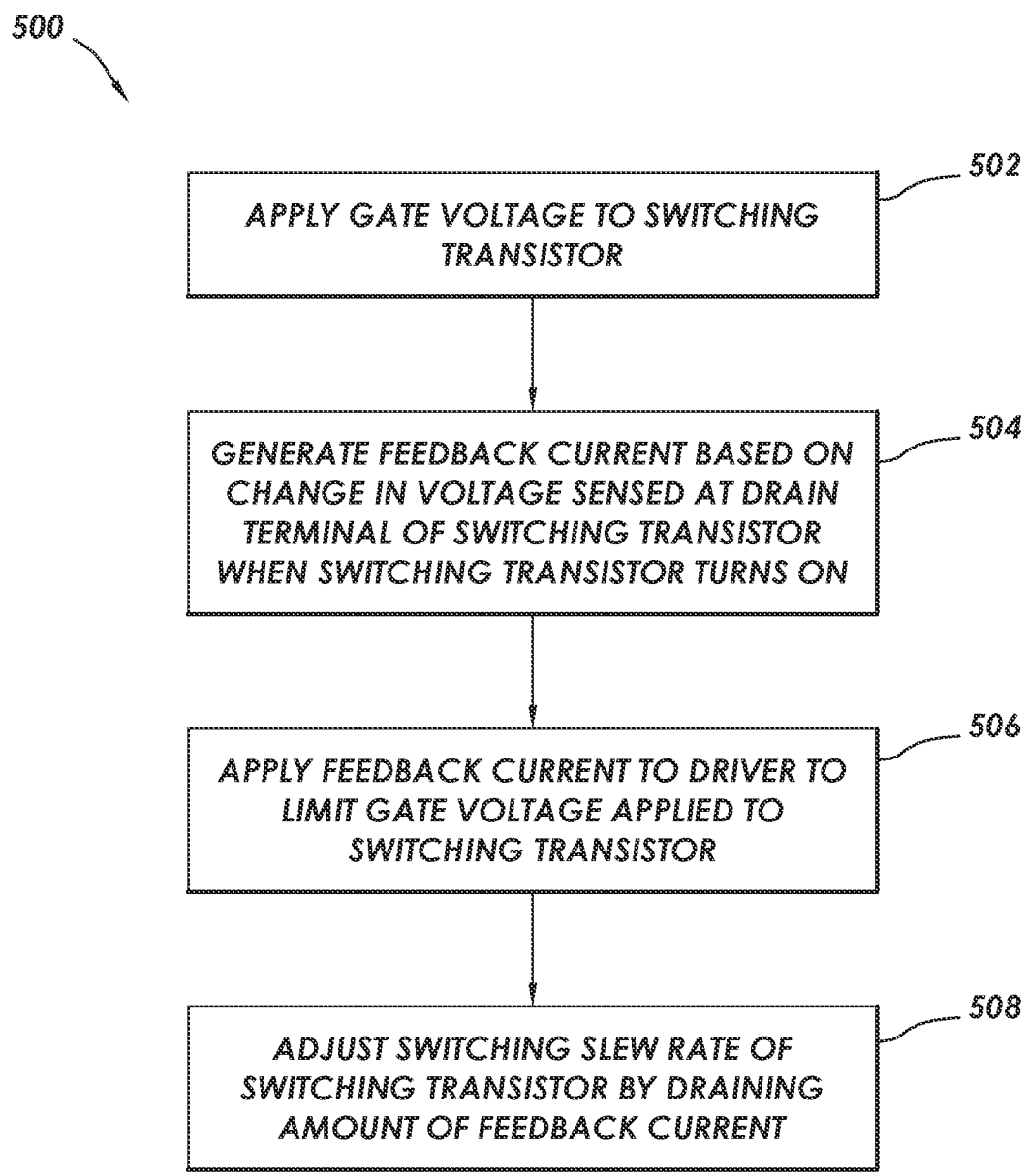
FIG. 5 is a flow diagram of an example of a method for operating a switching circuit in accordance with some implementations.

FIG. 5 is a flow diagram of an example of a method 500 for operating the switching circuit 102 in accordance with some implementations. At block 502, a gate voltage is applied to the switching transistor 114. For example, the driver 116 applies a gate voltage to the gate terminal of the switching transistor 114. At block 504, feedback current is generated based on a change in voltage sensed at the drain terminal of the switching transistor 114 when the switching transistor 114 turns on. For example, the feedback capacitor 118 generates feedback current based on the change in voltage sensed at the drain terminal of the switching transistor 114 when the switching transistor 114 turns on. At block 506, the feedback current is applied to the driver 116 to limit the gate voltage applied to the switching transistor 114. For example, the feedback current may interfere constant current Iref supplied by the current source 406 and keep the voltage of gate capacitor 404 constant, which in turn keeps the gate voltages of the voltage follower transistor 402 and the switching transistor 114 constant as well. At block 508, the switching slew rate of the switching transistor 114 is adjusted by draining an amount of the feedback current. For example, the controller 120 may drain an amount of the feedback current using the control transistor 416 illustrated in FIG. 4 and the amount of current drained may be set based on the gate voltage applied to the control transistor 416.

Figure 6:
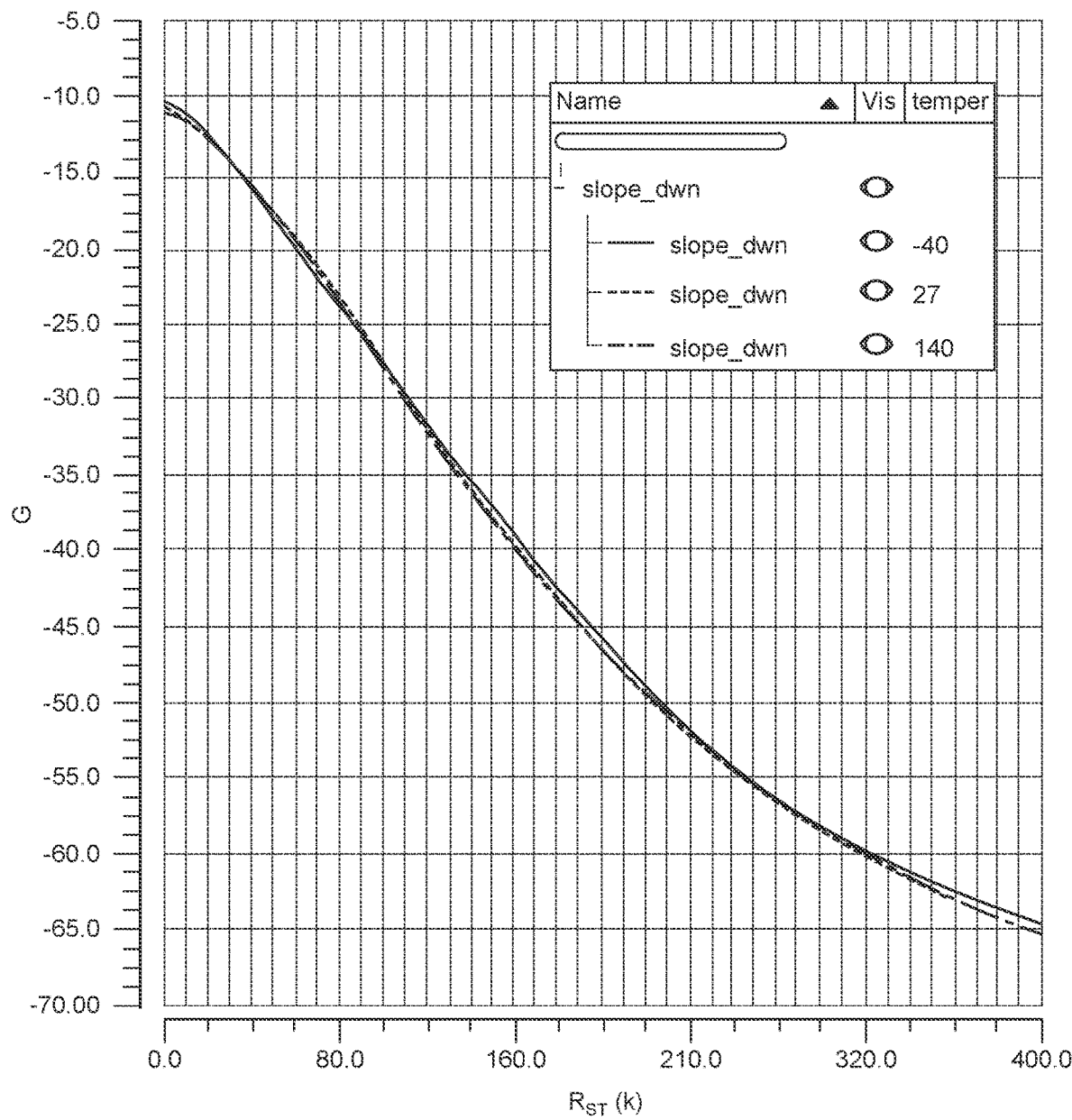
FIG. 6 is a plot of examples of switching slew rates of a lower switching circuit at different resistances and operating temperatures in accordance with some implementations.
Figure 7:
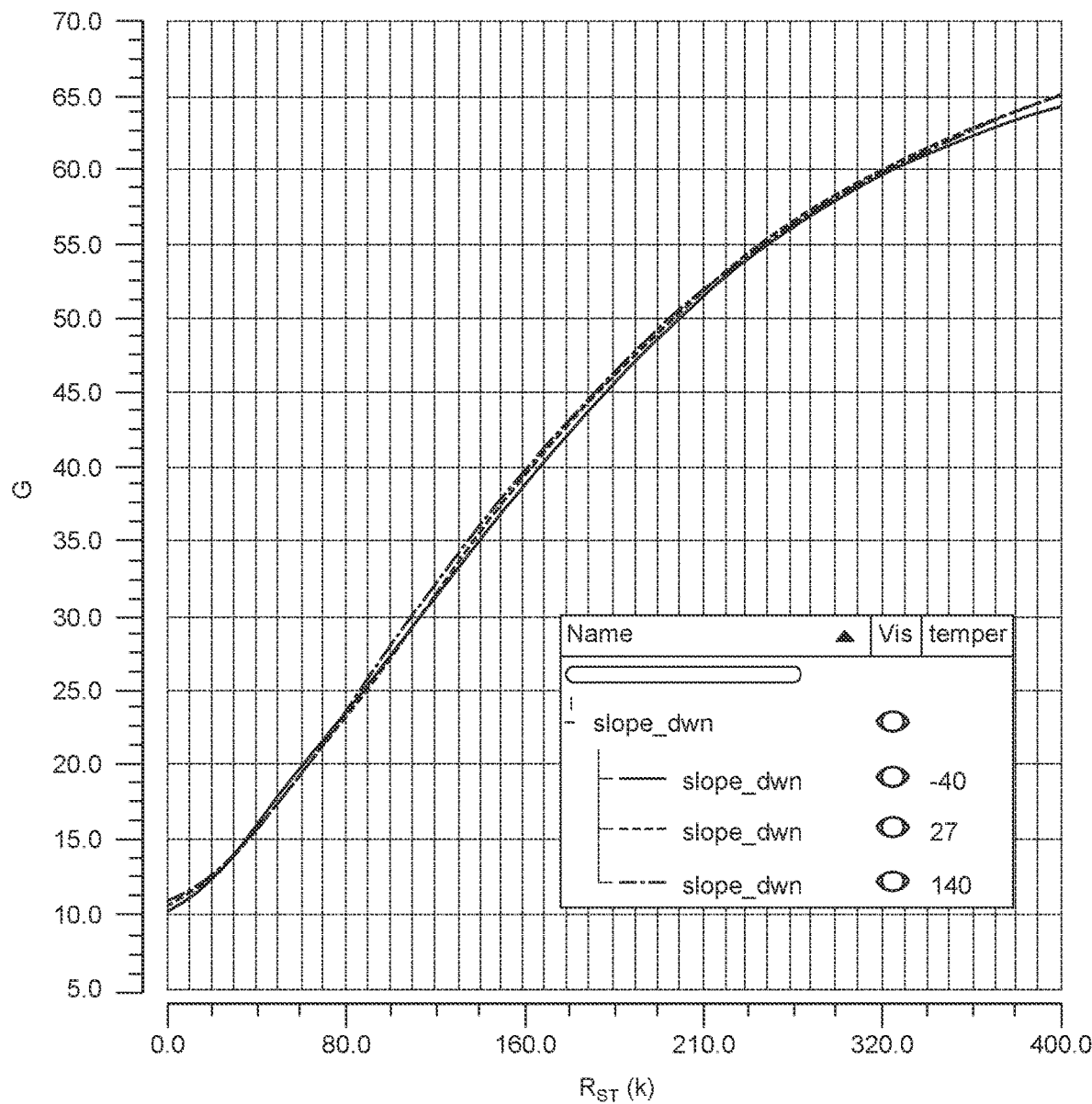
FIG. 7 is a plot of examples of switching slew rates of an upper switching circuit at different resistances and operating temperatures in accordance with some implementations.
Figure 8:
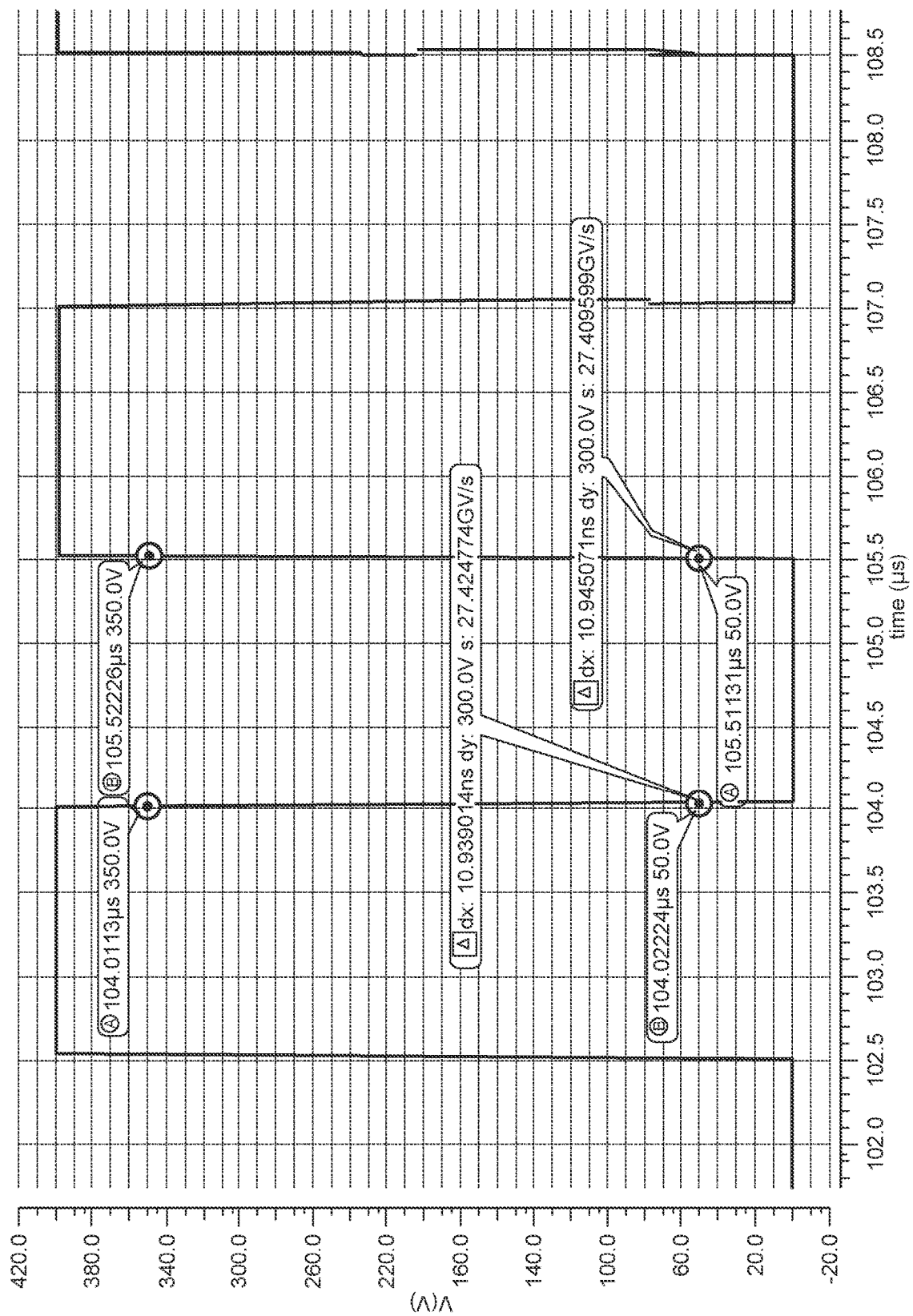
FIG. 8 is a timing diagram of an example operation of a half-bridge power converter in accordance with some implementations.
Figure 9:
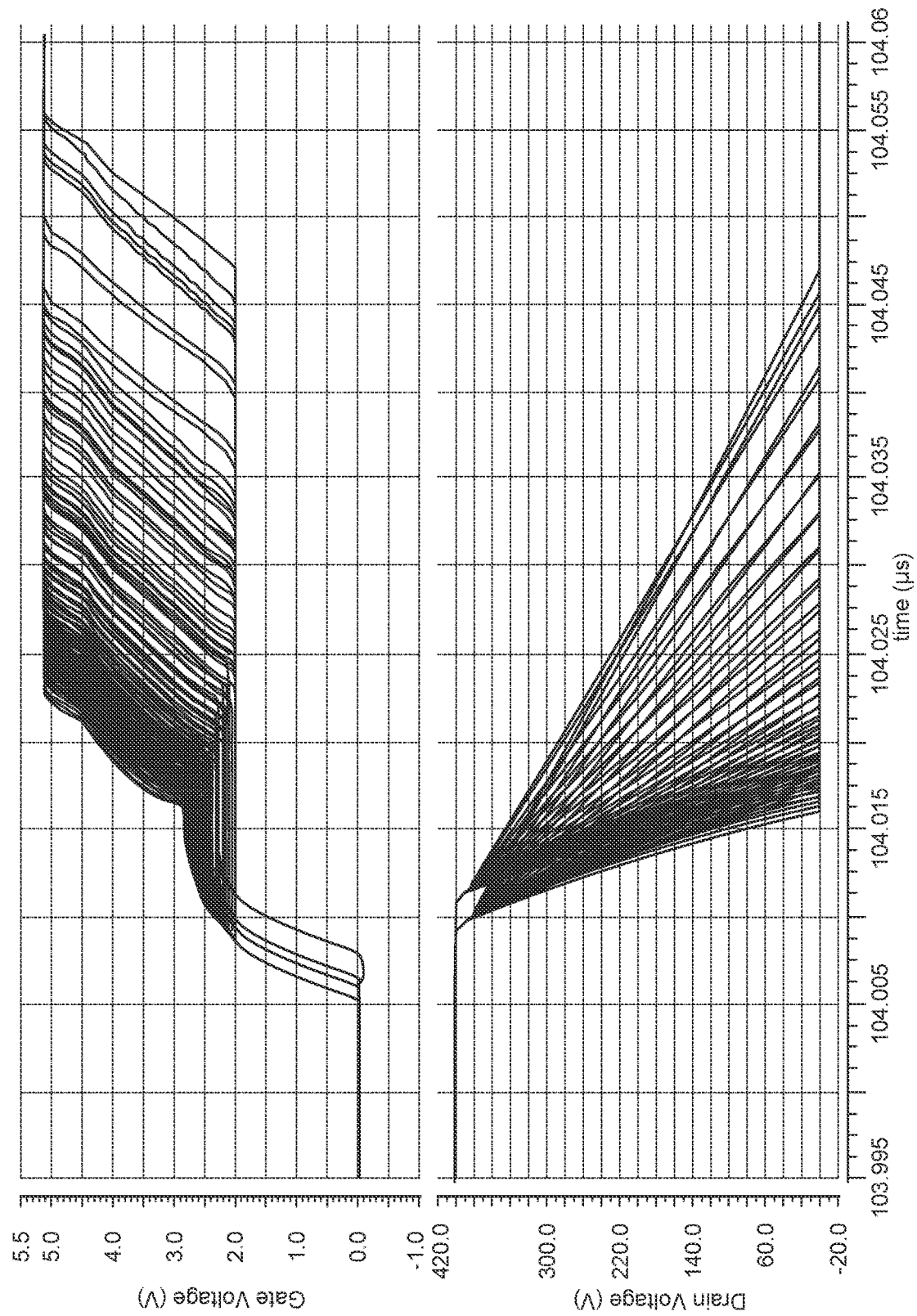
FIG. 9 is a timing diagram of examples of switching operations of a lower switching circuit at different feedback currents and operating temperatures.
Figure 10:
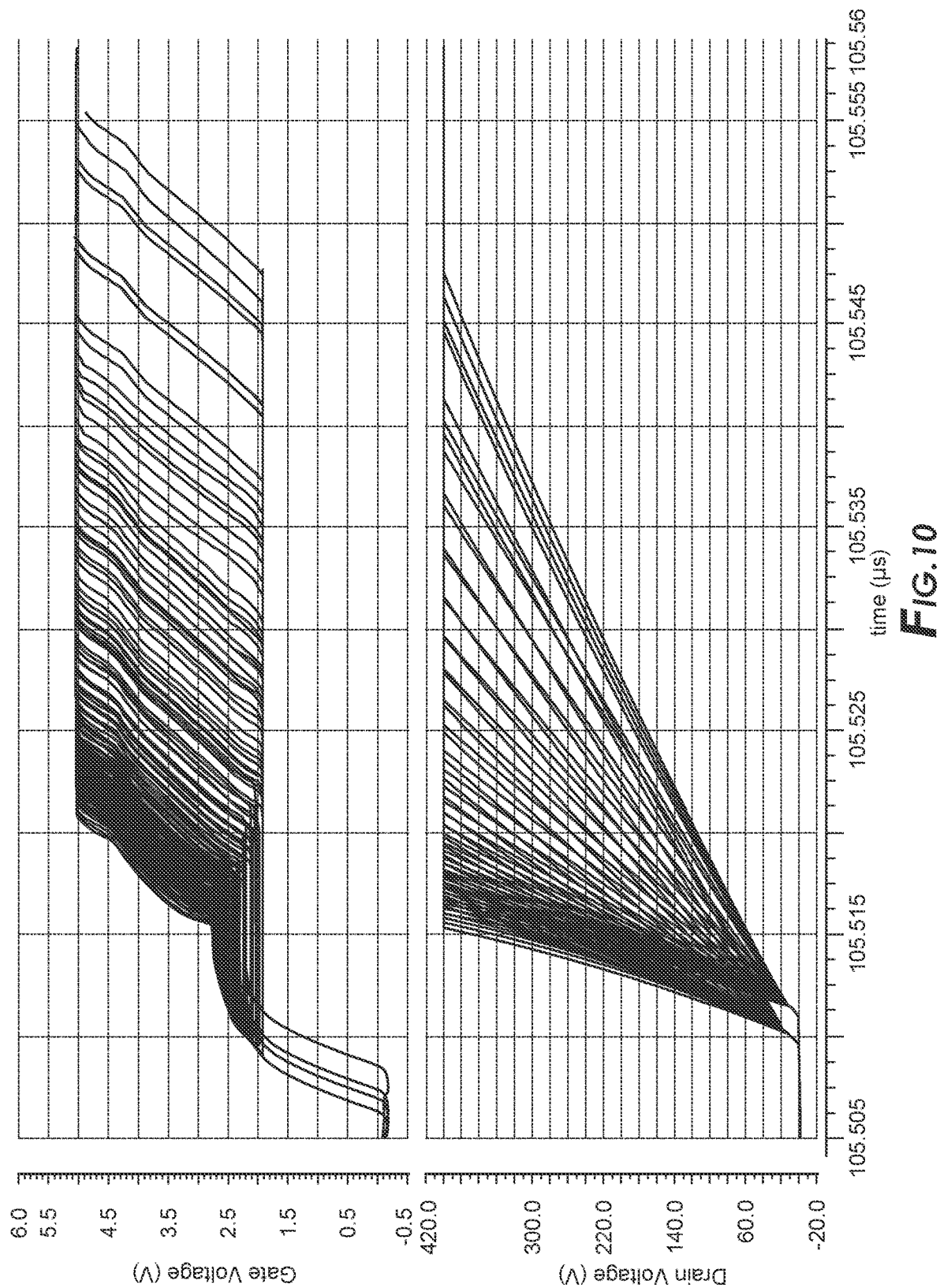
FIG. 10 is a timing diagram of examples of switching operations of an upper switching circuit at different feedback currents and operating temperatures.

As described above in relation to FIG. 4, in some implementations, the amount of feedback current drained by the controller 120 is set based on the resistance value of a resistor (e.g., external resistor 418 in FIG. 4). FIG. 6 is a plot of examples of switching slew rates of the switching transistor 114 at different resistances and operating temperatures. As illustrated in FIG. 6, the switching slew rate of the switching transistor 114 has a very low temperature dependency. Returning to FIG. 1, in some implementations, switching circuit 104 of the half-bridge power converter 100 is configured to set its switching slew rate in a manner substantially similar to switching circuit 102. For example, switching circuit 104 may be configured to set its switching slew rate based on the resistance of a resistor. FIG. 7 is a plot of examples of switching slew rates of switching circuit 104 at different resistances and operating temperatures. Similar to FIG. 6, the switching slew rates illustrated in FIG. 7 indicate a very low temperature dependency. FIG. 8 is a timing diagram of an example operation of the half-bridge power converter 100 in accordance with some implementations. As illustrated in FIG. 8, the switching slew rates of switching circuits 102 and 104 are set to match each other. FIG. 9 is a timing diagram of examples of switching operations of a lower switching circuit (e.g., switching circuit 102) at different feedback currents and operating temperatures. FIG. 10 is a timing diagram of examples of switching operations of an upper switching circuit (e.g., switching circuit 104) at different feedback currents and operating temperatures. As illustrated in FIGS. 9 and 10, propagation delay is dependent on temperature only.

The switching slew rate control techniques described herein are not affected by used switch Miller capacitance as in solutions where slew rate is controlled by gate driver strength only. The switching slew rate control techniques described herein are invariant to used switch parameters (which can simplify manufacturing). The switching slew rate control techniques described herein are also invariant to application parameters (which provides an end-user friendly solution). The switching slew rate control techniques described herein provides a constant turn-on propagation delay (i.e., time to plateau) with any slew rate preset. The switching slew rate control techniques described herein result in a more linear switching transition (which can reduce the impact of EMI). Further, the switching slew rate control techniques described herein are suitable for both applications with external power switches and integrated power switches.

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s).

The above discussion is meant to be illustrative of the principles and various implementations of the present invention. Numerous variations and modifications will become apparent to those skilled in the art once the above disclosure is fully appreciated. It is intended that the following claims be interpreted to embrace all such variations and modifications.

What is claimed is:

1. A method for operating a switching circuit including a switching transistor coupled to a load, the method comprising:
    applying, with a driver, a gate voltage to the switching transistor;
    generating, with a feedback capacitor, a feedback current based on a change in a voltage sensed at a drain terminal of the switching transistor when the switching transistor turns on;
    applying the feedback current to the driver to limit the gate voltage applied to the switching transistor; and
    adjusting, with a controller, a switching slew rate of the switching transistor by draining an amount of the feedback current.

2. The method of claim 1, adjusting the switching slew rate of the switching transistor further includes draining the amount of the feedback current with a control transistor included in the controller.

3. The method of claim 1, wherein the gate voltage is a first gate voltage, wherein applying the gate voltage to the switching transistor further includes:
    applying, with a voltage follower transistor included in the driver, the first gate voltage to the switching transistor, applying, with a gate capacitor included in the driver, a second gate voltage to the voltage follower transistor, and applying, with a current source included in the driver, a constant current to the gate capacitor, wherein the feedback current interferes with the constant current.

4. The method of claim 1, further comprising adjusting the feedback current with a biasing transistor.

5. The method of claim 1, wherein the switching transistor includes a gallium nitride transistor.

6. A switching circuit, comprising:
    a switching transistor coupled to a load;
    a driver including:
        a voltage follower transistor configured to apply a gate voltage to the switching transistor,
        a gate capacitor coupled to a gate terminal of the voltage follower transistor, and
        a current source configured to apply a constant current to the gate capacitor;
    a feedback capacitor coupled to a drain terminal of the switching transistor to generate a feedback current based on a change in a voltage sensed at the drain terminal of the switching transistor when the switching transistor turns on, wherein the feedback current interferes with the constant current and limits the gate voltage applied to the gate terminal of the switching transistor; and
    a controller configured to adjust a switching slew rate of the switching transistor by draining an amount of the feedback current.

7. The switching circuit of claim 6, wherein the gate voltage is a first gate voltage, wherein the controller includes a control transistor, and wherein the amount of the feedback current drained by the controller is set based on a second gate voltage of the control transistor.

8. The switching circuit of claim 7, wherein the switching circuit further comprising a resistor coupled to the control transistor to set the second gate voltage of the control transistor.

9. The switching circuit of claim 6, wherein the switching transistor, the feedback capacitor, the driver, and the controller are positioned within a chip housing, wherein the controller is coupled to a control terminal of the chip housing, and wherein the controller is further configured to:
    receive an external control signal via the control terminal, and
    adjust the switching slew rate of the switching transistor based on the external control signal.

10. The switching circuit of claim 6, further comprising a biasing transistor configured to adjust the feedback current.

11. The switching circuit of claim 6, wherein the switching transistor includes a gallium nitride transistor.

12. A half-bridge power converter, comprising:
    a first switching circuit coupled to a load; and
    a second switching circuit including:
        a switching transistor coupled to the load,
        a driver configured to apply a gate voltage to the switching transistor,
        a feedback capacitor coupled to a drain terminal of the switching transistor to generate a feedback current based on a change in a voltage sensed at the drain terminal of the switching transistor when the switching transistor turns on, wherein the feedback current limits the gate voltage applied to a gate terminal of the switching transistor, and a controller configured to adjust a switching slew rate of the switching transistor by draining an amount of the feedback current.

13. The half-bridge power converter of claim 12, wherein the gate voltage is a first gate voltage, wherein the controller includes a control transistor, and wherein the amount of the feedback current drained by the controller is based on a second gate voltage of the control transistor.

14. The half-bridge power converter of claim 13, wherein the second switching circuit further includes a resistor coupled to the control transistor to set the second gate voltage of the control transistor.

15. The half-bridge power converter of claim 12, wherein the switching transistor, the feedback capacitor, the driver, and the controller are positioned within a chip housing, wherein the controller is coupled to a control terminal of the chip housing, and wherein the controller is further configured to:
receive an external control signal via the control terminal, and
adjust the switching slew rate of the switching transistor based on the external control signal.

16. The half-bridge power converter of claim 12, wherein the driver includes:
a voltage follower transistor configured to apply the gate voltage to the switching transistor,
a gate capacitor coupled to a gate terminal of the voltage follower transistor, and
a current source configured to apply a constant current to the gate capacitor,
wherein the feedback current interferes with the constant current.

17. The half-bridge power converter of claim 12, wherein the second switching circuit further includes a biasing transistor configured to adjust the feedback current.

18. The half-bridge power converter of claim 12, wherein the switching transistor includes a gallium nitride transistor.

19. The half-bridge power converter of claim 12, wherein the load includes an inductor and a capacitor coupled in a series configuration between the drain terminal of the switching transistor and a reference terminal.

20. The half-bridge power converter of claim 12, wherein the first switching circuit is coupled between a high voltage supply and the load, wherein the drain terminal of the switching transistor is coupled to the load, and wherein a source terminal of the switching transistor is coupled to a reference terminal.

\* \* \* \* \*